United States Patent
Henry et al.

(10) Patent No.: US 10,984,705 B2
(45) Date of Patent: *Apr. 20, 2021

(54) COLOUR ILED DISPLAY ON SILICON

(71) Applicant: Facebook Technologies, LLC, Menlo Park, CA (US)

(72) Inventors: William Henry, Cork (IE); Padraig Hughes, Cork (IE); Joseph O'Keeffe, Bellevue, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/675,004

(22) Filed: Nov. 5, 2019

(65) Prior Publication Data

US 2020/0126477 A1    Apr. 23, 2020

Related U.S. Application Data

(63) Continuation of application No. 15/329,552, filed as application No. PCT/EP2015/067749 on Jul. 31, 2015, now Pat. No. 10,515,580.

(30) Foreign Application Priority Data

Jul. 31, 2014   (GB) .................................. 1413578.4

(51) Int. Cl.
*G09G 3/32* (2016.01)
*H01L 25/075* (2006.01)
(Continued)

(52) U.S. Cl.
CPC .............. *G09G 3/32* (2013.01); *G09G 3/2003* (2013.01); *H01L 25/0753* (2013.01);
(Continued)

(58) Field of Classification Search
CPC ........................................................ G09G 3/32
See application file for complete search history.

(56) References Cited

U.S. PATENT DOCUMENTS 7,518,149 B2     4/2009  Maaskant et al.
8,333,860 B1*   12/2012  Bibl .................. H01L 21/67144
                                                              156/249
(Continued)

FOREIGN PATENT DOCUMENTS

CN         2741133 Y    11/2005
CN         1765156 A     4/2006
(Continued)

OTHER PUBLICATIONS

Japan Patent Office, Japanese Office Action, Japanese Patent Application No. 2017/505214, dated Sep. 3, 2019, 5 pages.
(Continued)

*Primary Examiner* — Gustavo Polo
(74) *Attorney, Agent, or Firm* — Fenwick & West LLP

(57) ABSTRACT

A method of fabricating an image generator for use in a display, the method comprising: fabricating a plurality of discrete ILED array chips comprising a plurality of ILED emitters configured to produce light having the same wavelength, and wherein each of the plurality of ILED array chips is configured to produce light having one of a plurality of wavelengths; positioning the plurality of discrete ILED array chips on a carrier substrate such that a plurality of ILED emitters from adjacent chips form a pixel of a display; and bonding a first surface of the plurality of ILED array chips to a driver backplane such that electrical contacts of the plurality of ILED array chips are in electrical communication with the driver backplane, wherein the driver backplane comprises electronics for driving the ILED array chips.

20 Claims, 6 Drawing Sheets

(51) Int. Cl.
*G09G 3/20* (2006.01)
*H01L 25/16* (2006.01)
*H01L 33/62* (2010.01)
*G09F 9/302* (2006.01)

(52) U.S. Cl.
CPC ............ *H01L 25/167* (2013.01); *H01L 33/62* (2013.01); *G09F 9/302* (2013.01); *H01L 2924/0002* (2013.01); *H01L 2933/0066* (2013.01)

(56) References Cited

U.S. PATENT DOCUMENTS

| | | | |
|---|---|---|---|
| 8,557,616 | B2 | 10/2013 | Lau et al. |
| 10,515,580 | B2 * | 12/2019 | Henry ................... H01L 25/167 |
| 2004/0150651 | A1 | 8/2004 | Phan |
| 2011/0041329 | A1 | 2/2011 | Tong et al. |
| 2013/0207964 | A1 | 8/2013 | Fleck et al. |
| 2013/0278631 | A1 * | 10/2013 | Border ................... G02C 5/143 |
| | | | 345/633 |
| 2014/0056003 | A1 | 2/2014 | Frattalone |
| 2014/0159043 | A1 | 6/2014 | Sakariya et al. |

FOREIGN PATENT DOCUMENTS

| | | |
|---|---|---|
| CN | 101449382 A | 3/2007 |
| CN | 102903804 A | 1/2013 |
| JP | 2002/261335 A | 9/2002 |
| JP | 2007/027157 | 2/2007 |
| JP | 2007/180163 A | 7/2007 |
| JP | 2011/527519 | 7/2009 |
| JP | 2009/533810 | 9/2009 |
| JP | 2010-232577 | 10/2010 |
| JP | 2010/232577 A | 10/2010 |
| JP | 2014/514608 | 6/2014 |
| WO | WO 2004/071700 A2 | 8/2004 |
| WO | WO 2004/097947 A2 | 11/2004 |
| WO | WO 2010/014032 A1 | 2/2010 |

OTHER PUBLICATIONS

Japan Patent Office, Office Action, Japanese Patent Application No. 2017-505214, dated May 16, 2019, 11 pages.
National Intellectual Property Administration of China, Office Action, Chinese Patent Application No. 201580052942. 7, dated Nov. 15, 2018, seventeen pages.
PCT International Search Report and Written Opinion, PCT/EP2015/067749, dated Jun. 10, 2015, 11 Pages.
Japan Patent Office, Japanese Office Action, Japanese Patent Application No. 2017/505214, dated Dec. 24, 2019, 13 pages.

* cited by examiner

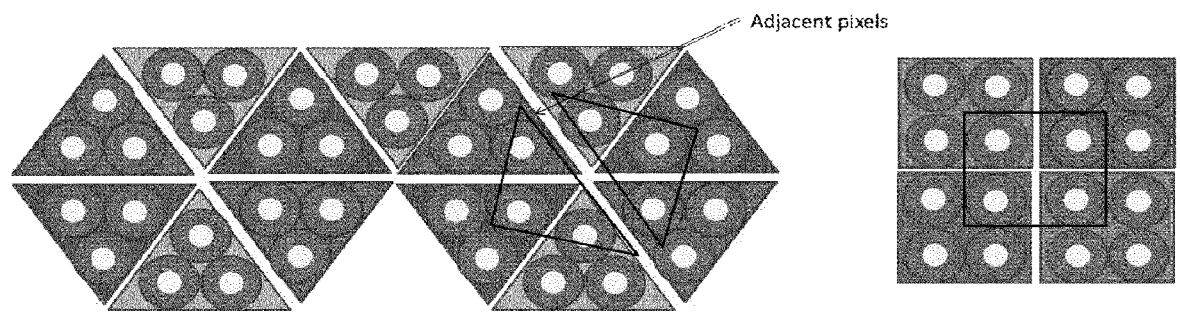
Fig. 5a  Fig. 5b
Carrier substrate with multi colour chips
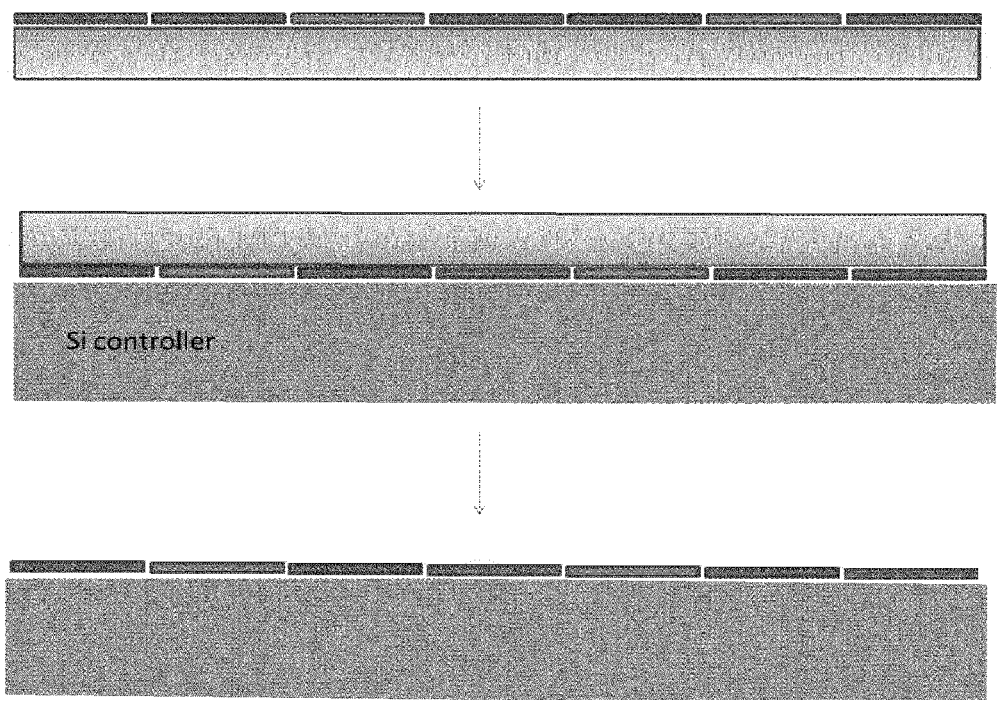
Fig. 6

Side View          Top View

COLOUR ILED DISPLAY ON SILICON

CROSS REFERENCE TO RELATED APPLICATIONS

This application is a continuation of U.S. application Ser. No. 15/329,552, filed Jan. 26, 2017, which is a National Phase application of International Application No. PCT/EP2015/067749, filed Jul. 31, 2015 which claims the benefit of United Kingdom Application No. 1413578.4, filed Jul. 31, 2014, each incorporated by reference in its entirety.

TECHNICAL FIELD

The invention relates to an optical display module. Specifically, the invention relates to, but is not limited to, an ILED RGB color display module involving hybrid integration of non silicon Red, Blue and Green LED emitters forming the ILED display device. Exemplary emitters may be mounted on silicon drive circuitry integrated directly using appropriate 3D package integration methods.

BACKGROUND

A new category of display technology is called the ILED (Inorganic Light Emitting Diode) display, an alternative to the better known LCD (Liquid Crystal Display) and the OLED (Organic Light Emitting Diode) displays. An ILED display does not have any of the negative qualities of LCD or OLED displays as it is inherently the same as a standard LED and has all the advantages thereof. It will have high quality black output, high quality white output, no dither, high quality uniformity, long lifespan, very low power consumption, predictable colour gamma, fast response rates and negligible flicker.

Projection display technology ranges from large area projection displays (screen displays) to miniature microdisplays such as headup imaging displays.

Projection displays generally consist of 4 components: a light source, an imaging engine, a driver and an optical path. The light source provides input light for the imaging engine. The imaging engine then manipulates the light to produce the image. The driver instructs the imaging engine how the required image should be produced—i.e. which pixels should be on or off. Finally, the optical path will expand, contract or otherwise control the image such that it is as specified by the system for the intended application.

The light required for projection can be generated as a continuous emission band (halogen, fluorescent bulbs, white LEDs) or in discrete bands (RGB LEDs, laser sources). The imaging engine options include Digital Light Processing (DLP), galvano-scanning mirrors, Liquid Crystal Displays (LCD) or Liquid Crystal on Silicon (LCOS). For example in LCD, the enabling engine is the liquid crystal plus a series of filters to control the light color. LCD displays however require a backlight which typically consists of an array of LED devices and a diffuser to provide uniform illumination. Similarly for large scale LED displays (sports stadia/shop mall screens), the light source and imaging engine are combined using large area ILED chips packaging in standard SMT formats. In the above examples the driver is the control electronics (in the form of an active backplane or a silicon controller chip) which decides the pixels to be activated based on incoming data (presumably from a graphical processing unit).

At the other end of the display scale size are microdisplays. In these devices either a very small image or a very small imaging system is targeted. A very small image may be used in retina projected displays (such as used in the Google Glass) while a small imaging system is required for other heads-up type displays. A range of image engines and light sources have been employed in such devices including those listed above. Of commercial interest today is OLED technology. OLED technology is comparable to large scale ILED displays where the light source and imaging engine are one in the same. However, the manufacturing method while not capable to manufacture large scale displays equivalent to ILED is nevertheless capable of manufacturing high resolution displays with 250+ ppi equivalent to LCD technology. As with the displays above, the driver of an OLED display may be an active backplane or a silicon controller chip.

Both OLED and LCD type displays have significant drawbacks for achieving higher resolution pixel for microdisplays with, for example, sub 15 μm pixel pitch. For example, OLED's have limited resolution because of the shadow mask manufacturing process which limits the resolution to <300 ppi. Methods to overcome this include pentile emitter design configurations for R, B and G chips to enhance the resolution of the OLED display to 300+ ppi. This design overcomes the resolution issues associated with shadow mask manufacture with OLEDs and eliminates uniformities with TFT's to produce an overall smooth defect free image.

Other methods exist to achieve higher resolution displays by monolithic array manufacturing methods. Monolithic is used to refer to a component that is indivisible from another and is formed from a larger block. The term "monolithic array" refers to a light emitting device that has several addressable emitting areas which are fabricated on the same material and are physically connected. A monolithic array is particular to Inorganic LED devices and is not formed from OLED materials. This is due to the difference in manufacturing of the two LED types. Inorganic LEDs are fabricated using a "top-down" method. In this method, the starting point is a singular piece of semiconductor material from which the LEDs are produced. If physical contact between a number of light emitting areas remains at the end of the fabrication processes (i.e. the semiconductor material has not be separated), then it can be said that a monolithic array has been produced. The monolithic ILED array chip is a singular piece of semiconductor material in which multiple emitting areas are formed. This is distinct from the assembly of light emitting devices on a physical interconnect that allows them to be transposed in unison.

In contrast, organic LEDs are fabricated by a "bottom-up" approach. This occurs by the deposition of organic materials in repeated layers on a target substrate. Since an OLED device does not start from singular piece of semiconductor material, the finished device cannot be considered monolithic. It is noted that in certain publications, monolithic OLEDs may be referred to. However, this is related to the integration of the OLED device directly on a driver circuit, commonly a CMOS. In this case, the backplane or CMOS chip, which has been formed from a "top-down" approach, is monolithic and the OLED material has been is integrated with it to form a monolithic component.

The fabrication of monolithic ILED devices is necessitated because of the need to avoid chip manufacture and micropostioning at the scale of 10 μm or less. Examples can include the fabrication of chips containing as an example 160×120 individually addressable pixels on a mono-lithic chip >1 mm×1 mm. Displays based on large monolithic ILED chips have inherent challenges. Firstly, since the ILED device begins from a singular piece of semiconductor material, the monolithic ILED array chip can only produce a single wavelength of light. In addition, the fabrication of monolithic ILED array devices produces issues associated with yields. When ILED devices are fabricated there will be a number of devices that are failed. When singular devices are fabricated then only the failed devices are discarded. However, with monolithic ILED array chips, a failed device will result in the discarding of the whole monolithic chip. In the example above of a 160×120 monolithic array, the failure of a single device results in the discarding of 19,200 emitters—the majority of which may be functional. This results in lower yields based on material used and fabrication quality.

It is important to note the distinct challenges associated with ILED and with OLED devices. For the fabrication of ILED array chips, the fabrication of features sizes of 1 µm (or smaller using nano-imprint lithographic techniques) is achievable. However, the ability to pick-and-place or micro-assemble ILED devices of sizes smaller that 10×10 pm2 (100 pm2) remains a very significant challenge. For OLED devices, the ability to form devices of sizes less than 10 µm is a challenge due to shadow masking and other effects associated with the deposition processes used. However, since OLED devices can be fabricated directly onto the target control devices (such as a CMOS or TFT backplane) there is no requirement to pick-and-place the devices after fabrication. OLEDs can be white and use filters.

Monolithic methods for high resolution active matrix monochromatic displays on silicon have been presented U.S. Pat. No. 8,557,616 B2 for LED technology. In this document, a singular piece of ILED material is integrated with the driver circuitry and results in a device which produces a single colour.

SUMMARY

The current invention seeks to overcome the drawbacks in current microdisplays. The current invention provides methods and apparatus for a plurality of monolithic ILED array chips arranged on a backplane driver, each monolithic ILED array chip providing an ILED emitter for a plurality of adjacent pixels of an image generator.

As used herein, the term "image generator" encompasses an array of ILED (or µILED) array chips that provide light for a plurality of pixels. The ILED array chips comprise a plurality of ILED emitters, may be monolithic and may generate light all of a single colour. Each ILED emitter of an ILED array chip provides light to one of adjacent pixels of the image generator. The image generator may be considered as a single device that provides a light source and an image engine of a display.

In view of the above, the inventors have recognised the need to manufacture a high resolution micro-display fabricated from ILED devices which provides for sub 15 µm pitch and does not suffer from yield issues associated with monolithic ILEDs. Due to the use of an ILED platform, it does not suffer from the lifetime, aging or resolution issues associated with OLED devices. In this invention, a high pixel resolution display is disclosed which is fabricated from small ILED array chips using hybrid micro-assembly technologies.

The invention is related to display technology and an optical image engine combining inorganic LED light sources and control electronics to switch on/off each pixel of the display. Specifically, it may be related to projection displays where the image is produced at a distance away from the light source and the image forming engine. Projection display technology ranges from large area projection displays (screen displays) to miniature microdisplays such as headup imaging displays.

The current invention seeks to overcome the drawbacks in current microdisplay architectures. The current invention results in the improvements inherent with inorganic LEDs over organic LEDs. These include increased stability, increased power efficiency and increased brightness.

The inventors have identified a need to form a full color display module that combines dissimilar materials for Red, Green and Blue emitting sources, connected on the backside to IC driver circuitry using a suitable wireless interconnect bonding method. Wireless direct bonding methods eliminate the need for wirebonds, solder bumping/flipchip techniques thus simplifying interconnections.

Disclosed herein is a novel ILED image generator for a colour display with associated drive electronics. Disclosed is a method of realising a high resolution pixel image engine using inorganic LEDs (ILEDs). Specifically a method is disclosed for arranging ILED array chips of a particular shape(s) each with a plurality of emitters to form a high density display with minimal fill factor losses. The design of the ILED array chips is also disclosed.

The image generator can be either monochromatic or multi-wavelength depending on the application requirement. This design provides ultra-high density LED light source specifically suited to near-to-the-eye and pico-projector applications.

According to an aspect of the invention, there is provided a method of fabricating an image generator for use in a display, the method comprising: fabricating a plurality of discrete ILED array chips comprising a plurality of ILED emitters configured to produce light having the same wavelength, and wherein each of the plurality of ILED array chips is configured to produce light having one of a plurality of wavelengths; positioning the plurality of discrete ILED array chips on a carrier substrate such that a plurality of ILED emitters from adjacent chips form a pixel of a display; and bonding a first surface of the plurality of ILED array chips to a driver backplane such that electrical contacts of the plurality of ILED array chips are in electrical communication with the driver backplane, wherein the driver backplane comprises electronics for driving the ILED array chips.

Optionally, ILED array chips configured to emit light having a first wavelength are positioned on the carrier substrate in a first step, and wherein ILED array chips configured to emit light having a second wavelength are positioned on the carrier substrate in a second step.

Optionally, the driver backplane is formed by a silicon wafer, a TFT backplane or other ILED driver electronics.

Optionally, the method further comprising removing the carrier substrate.

Optionally, the carrier substrate is substantially transparent, and wherein a light emitting surface of the ILED array chips is facing the carrier substrate, the electrical contacts of the ILED array chips being located on a side of the ILED array chip opposite the light emitting surface.

Optionally, the carrier substrate is a cover glass for the image generator.

Optionally, the carrier substrate comprises glass, plastics material or another transparent material.

Optionally, the carrier substrate is either flexible or rigid.

Optionally, the carrier substrate comprises one or more optical components configured to manipulate light emitted from the image generator.

Optionally, the plurality of ILED array chips are bonded to the carrier substrate using a glue and, optionally, wherein the glue is transparent.

Optionally, the plurality of ILED array chips comprises at least one ILED array chip configured to produce each of red, green or blue light.

Optionally, the method further comprising forming the plurality of ILED array chips as one of triangular, rectangular, hexagonal, or any other geometric shape capable of tessellation.

Optionally, the method further comprising forming the plurality of ILED emitters at the corners of the plurality of ILED array chips.

Optionally, the method further comprising bonding at least one of the plurality of ILED array chips at a corner of image generator.

Optionally, the ILED array chips are bonded to the driver backplane using direct bonding interconnect.

Optionally, the method further comprising providing electrical communication to driver electronics such that a plurality of addressable pixels is defined, wherein each addressable pixel comprises at least one ILED emitter from a plurality of adjacent ILED array chips.

Optionally, the driver backplane comprises an active backplane.

Optionally, the active backplane is fabricated with amorphous silicon (a-Si) or low temperature poly silicon (LTPS) or Metal Oxide (MO-TFTs).

Optionally, the ILED emitters are micro ILED emitters.

According to an aspect of the invention there is provided an image generator for use in a display manufactured as described above.

According to an aspect of the invention there is provided a display comprising one or more image generators described above.

According to an aspect of the invention there is provided an ILED array chip comprising a plurality of ILED emitters, the ILED array chip being suitable for use in an ILED image generator comprising a plurality of discrete ILED array chips on a carrier substrate positioned such that a plurality of ILED emitters from adjacent chips form a pixel of a display.

Optionally, the ILED emitters comprise micro ILED emitters.

According to the invention in a first aspect, there is provided a method of fabricating an addressable LED array chip, the method comprising: fabricating a plurality of LED chips comprising one or more emitters, each LED chip being configured to produce one of red, green or blue light; bonding a first surface of the plurality of LED chips to a driver such that electrical contacts of the plurality of LED chips are in electrical communication with the driver, wherein the driver comprises electronics for driving the LED chips.

Optionally, the method further comprises bonding the LED chips to a carrier substrate, such that electrical contacts of the plurality of LED chips are on a second surface of the LED opposite the first surface and bonding the second surface of the LED chips to the driver.

Optionally, the driver is formed by a silicon wafer, a TFT backplane or another embodiment of LED driver electronics.

Optionally, the method further comprises removing the carrier substrate.

Optionally, the carrier substrate is either transparent or non-transparent.

Optionally, the carrier substrate is a cover glass for the addressable LED array chip.

Optionally, the carrier substrate comprises glass, plastics material or another transparent material.

Optionally, the carrier substrate is either flexible or rigid.

Optionally, the carrier substrate comprises one or more optical components configured to manipulate light emitted from the addressable LED array chip.

Optionally, a light emitting surface of each of the plurality of LED chips is bonded to the carrier substrate.

Optionally, the plurality of LED chips is bonded to the carrier substrate using a glue and, optionally, wherein the glue is transparent.

Optionally, the plurality of LED chips comprises at least one LED chip configured to produce each of red, green or blue light.

Optionally, the method further comprises forming the LED array chip as one of triangular, rectangular, hexagonal, or any other cornered geometric shape capable of tessellation.

Optionally, the method further comprises bonding at least one of the plurality of LED chips at a corner of the LED array chip.

Optionally, the LED chips are bonded to the silicon wafer using direct bonding interconnect.

Optionally, the method further comprises providing electrical communication to the driver electronics such that a plurality of addressable pixels is defined, wherein each addressable pixel comprises at least one LED chip from each of a LED array chips.

Optionally, the silicon wafer comprises an active backplane.

Optionally, the active backplane is fabricated with amorphous silicon (a-Si) or low temperature poly silicon (LTPS) or Metal Oxide (MO-TFTs).

According to the invention in a second aspect there is provided an addressable LED array chip manufactured according to the method described above.

According to the invention in a third aspect there is provided a micro image engine comprising a plurality of addressable LED array chips described above.

BRIEF DESCRIPTION OF DRAWINGS

FIG. 5a shows an RGB pixel from a triangular chip;

FIG. 5b shows an R,G,B,G pixel from a square chip;

FIG. 6 shows an ILED image engine platform with integrated Silicon Drive Circuitry a). with Glass Carrier for ILED's. & b). without Glass Carrier. By way of example a 3 pixel color display is presented;

FIG. 7a shows the starter material (LED wafers in Red, Green and Blue) from top and side views;

FIG. 7b shows the blue ILED devices which have been fabricated on a wafer from top and side views;

FIG. 7c shows the blue ILED devices which have been micro-assembled on the carrier substrate from top and side views;

FIG. 7d shows red, green and blue ILED devices which have been micro-assembled on the carrier substrate from top and side views;

FIG. 7e shows red, green and blue ILED devices being bonded to the control electronics to form the image engine from top and side views;

FIG. 7f shows the image engine after the optional removal of the carrier substrate;

DETAILED DESCRIPTION

Figure 1:
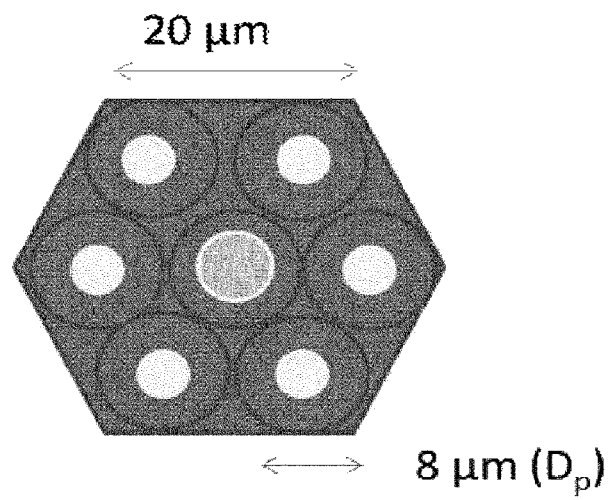
FIG. 1 is an example of a hexagonal shaped chip containing 6 LED pixels.

Methods and apparatus disclosed relate to a method of fabricating inorganic light emitters for ultra-high resolution applications. In particular the invention relates to a method of integrating an ILED Display on Si consisting of high density R, G and B ILED emitters (subpixels) of dissimilar materials and combining directly onto a mounting platform followed by subsequent integration with a Silicon substrate containing integrated IC drive/multiplex circuit. The ILED emitters may comprise μLEDs. Methods and apparatus also relate to applications where the light sources are directly integrated to a driver backplane via a number of possible platforms.

There is a need therefore to form a full color micro-image engine that combines dissimilar materials for Red, Green and Blue emitting sources to form a high density pixel and integrating directly to a backplane which combines thin film transistors (TFT) and discrete charge capacitors for scan and data line control.

In particular, an ILED arrangement may be based on the assembly and mounting of high performance array chips to form pixels or subpixels and ultimately form the image engine for a display. This enables the formation of large arrays of emitters for displays using small monolithic array chips. This also enables the fabrication of micro-displays based on ILED material without the need to manipulate and interconnect chips which would pose significant challenges to micro-assembly technologies.

A method to realise high resolution image engines for micro-displays is disclosed which enabled by the following means: 1) the manufacture of high performance ILED (e.g. PLED) arrays chips WO 2004/097947 (U.S. Pat. No. 7,518, 149) of differing shapes; 2) the ability to micro-assemble the ILED array chips into a suitable configuration to form a mosaic where chips are tiled together with a small pitch and 3) the interconnect of this mosaic to control electronics. In alternative methods, the mosaic may be formed directly on a controller device (such as a CMOS or TFT backplane) or on a carrier substrate which is subsequently integrated with the controller device. The shape of the chips allows for an array of chips of consistent pitch to be constructed using smaller chip sizes. Different configurations can be realised and the respective consistent pixels dictate the quality and color of the pixel.

Micro-assembly methods may include stamp processes, vacuum, piezoactuated, ink transfer, laser assist, self assembly and/or magnetic transfer as a method of creating arrays of ILED array chips on a substrate or controller device.

A detailed description of the steps associated with the method used to fabricate the ILED image generator is outlined below. FIG. 7a-f provides images associated with each step. The method described is for a RGB display which is mounted on a CMOS driver circuit. Variations of the method may be required for the integration with our driver circuits or in the production of monolithic or other colour variations. Such variations in the method are also covered by the current invention.

1) The starting material to be used is a semiconductor wafer. For an R,G,B display, three semiconductor wafers, one in each colour, are required.
2) Monolithic ILED array chips are fabricated in the semiconductor wafers. The layout of the ILED array chips on the substrate is dependent on the layout of the target display.
3) The monolithic ILED array chips from a single colour wafer are assembled on a carrier substrate using an appropriate micro-assembly method. The contact pads for the ILED array chips are facing away from the substrate.
4) Spaces are left for ILED array chips from the wafers of different colours
5) The monolithic ILED array chips from the other wafers are micro-assembled onto the carrier substrate.
6) The contacts for the ILED array chips are connected to the contact pads of a driver device. This may be completed in a single step as all the ILED array chips are on the carrier substrate.
7) The carrier substrate is removed from the ILED array devices.

It should be noted that the final image generator of the display is not monolithic. It is more correctly described as an array of small monolithic ILED array chips. This substantially differentiates the device from both monolithic ILED arrays (where the light source is fabricated from a single chip) and OLED devices integrated with monolithic driver circuits.

Several ILED array chip shapes and configurations are discussed. The simplest format is a square ILED array chip which has multiple ILED emitters, up to 4 in total with one at each corner. When these chips are tiled they form a N×M chip array, which has a corresponding pixel array in which each pixel comprises an emitter from a plurality of adjacent ILED array chips.

A display pixel is formed made up of ILED emitters, one from a corner of a plurality of neighbouring monolithic chips. When chips of different wavelengths are tiled in neighbouring positions, a white pixel consisting of 4 emitter elements can then be formed, e.g. Red, Green, Blue, Green pixel configuration. The second green compensates for the lower efficiency that is currently inherent in green LED material. Not all corners of the ILED array chip must have an emitter pixel. For example, an array of RGB could be formed using square chips with emitters at 3 corners and an n-contact or inactive area at the fourth corner.

Figure 2:
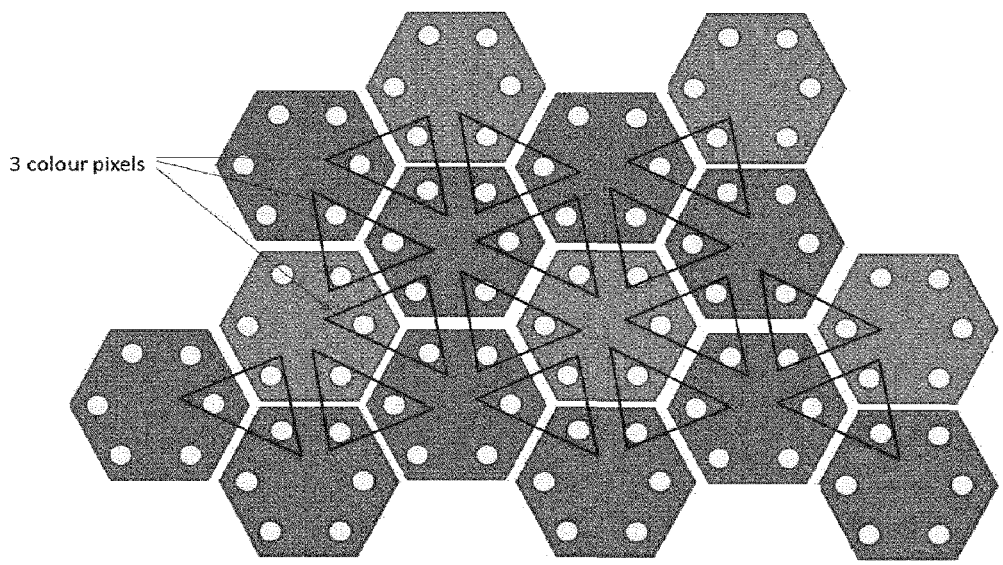
FIG. 2 shows tiled μLED chips with the RGB (white) pixels.

In exemplary methods and apparatus, a triangular or hexagonal array chip may be used in the formation of 3 pixel white elements, see FIG. 2, as the efficiency of use of material is maximised. This could lead to Red, Green, Blue pixels. FIG. 2 shows a plurality of ILED array chips that have been assembled onto a substrate using one or more of the assembly techniques discussed above. In one configuration the minimum size of the display pixels ($X_{min}$) (which is related to the display resolution) can be defined by $(2\times(D_p+D_e)+S_c)$ where:

Dp is the diameter of a ILED (e.g. μILED) emitter;

Sc is the separation between ILED array chips on the carrier; and $D_e$ is the distance of the ILED emitter from the edge of the chip.

Figure 4:
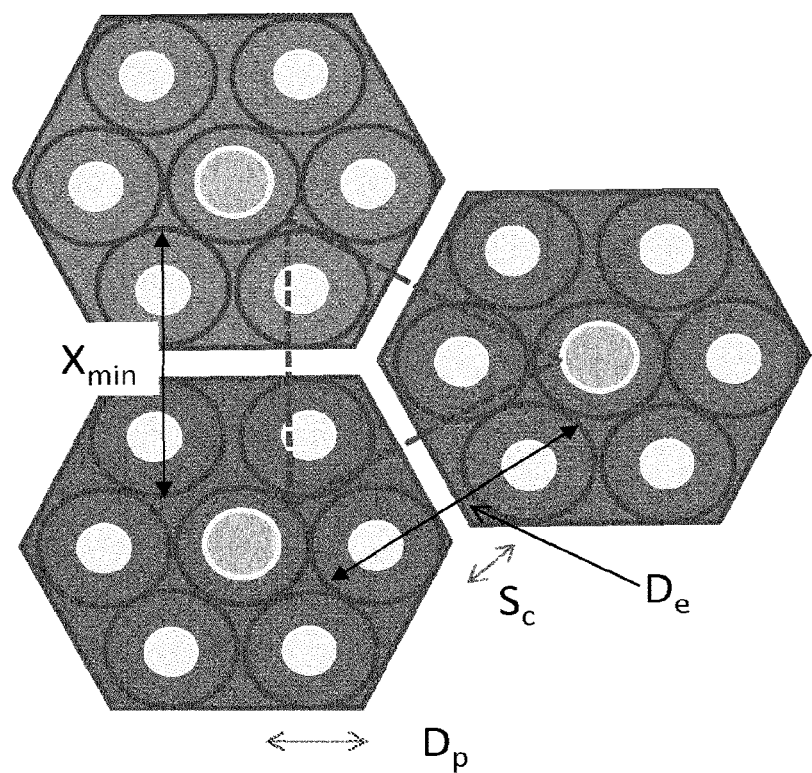
FIG. 4 shows an image of minimum display pixel size and the dependence on the ILED array layout and packing density.
Figure 7A:
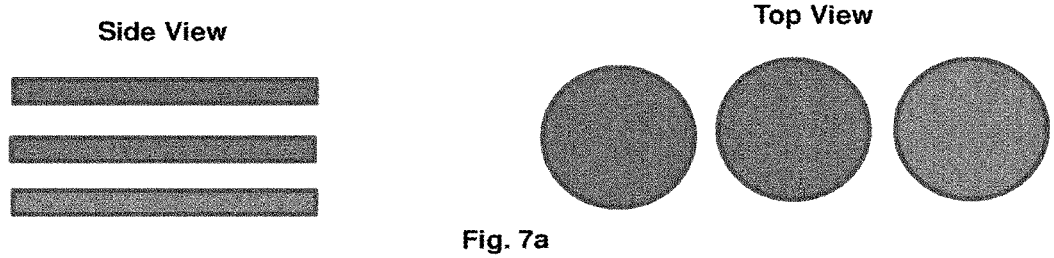
FIGS. 7a through 7f provide an overview of the image engine assembly process.
Figure 7B:
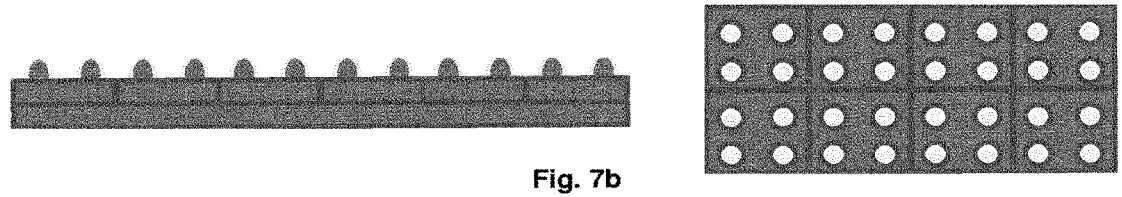
Figure 7C:
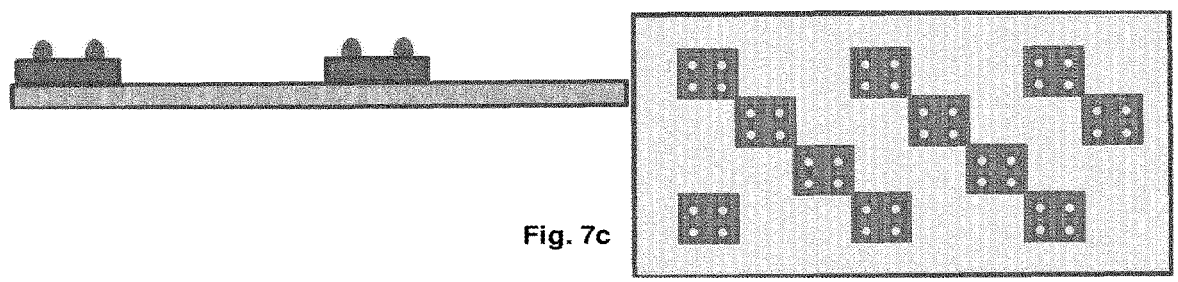
Figure 7D:
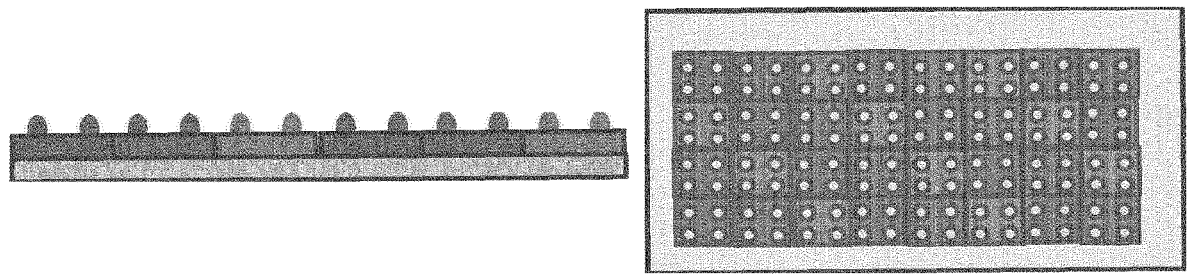
Figure 7E:
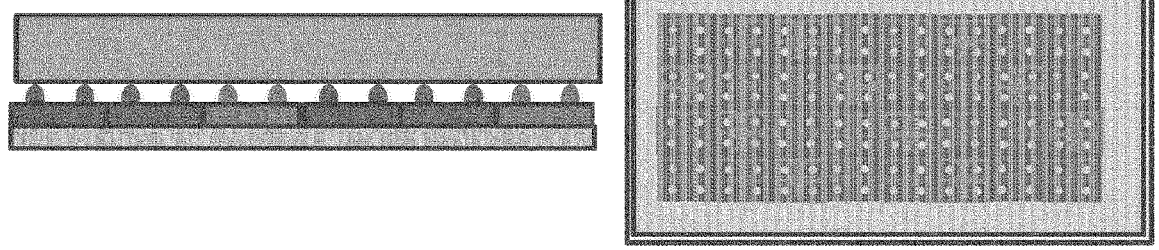
Figure 7F:
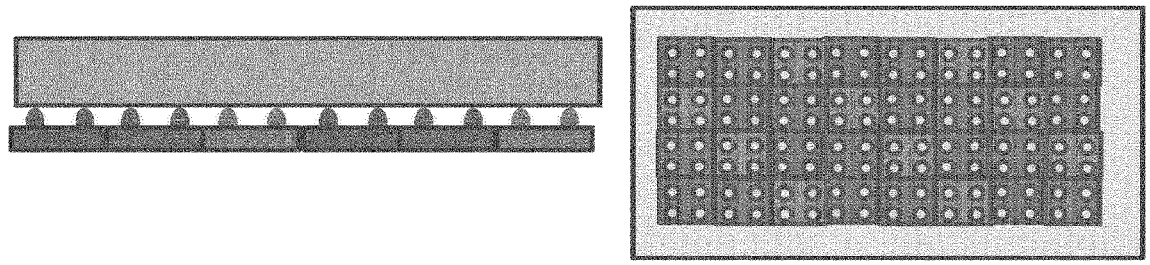

Further illustration of this is shown in FIG. 4.

Figure 8:
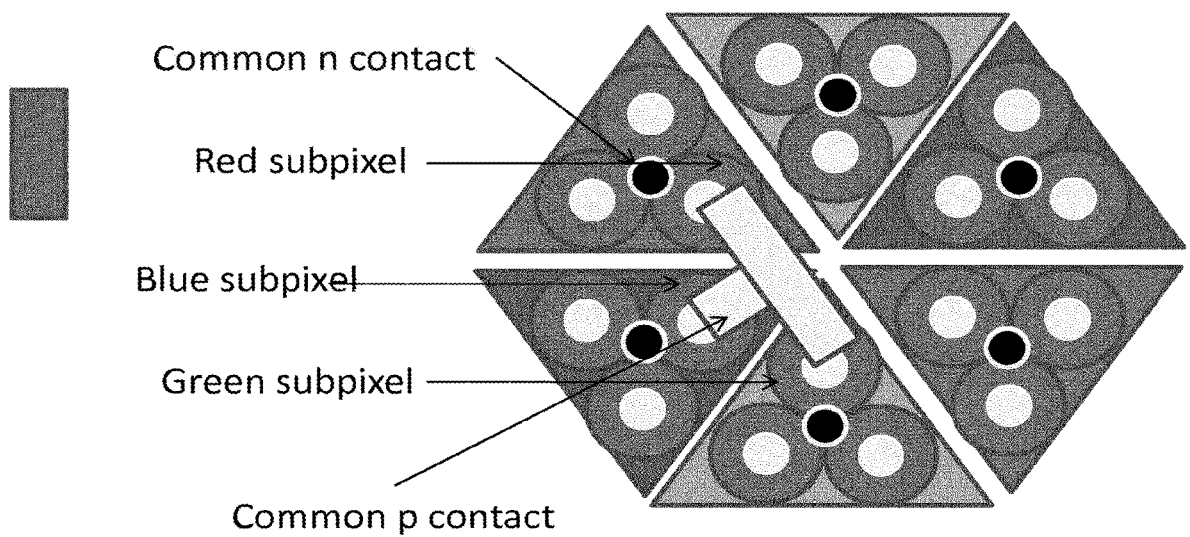
FIG. 8 gives an overview of a possible interconnection scheme at the device level.

The contacting of the chips to the driver backplane will be dependent on the design of the controller circuit. It is possible that all the p-contacts (anode) of the emitters in a display pixel could be connected in together. While these monolithic ILED array chips may share an n-contact with another ILED emitter, this would not be from the same display pixel. Therefore the light output from a display sub-pixel could be generated by driving a p-contact that is shared with another ILED array chip. FIG. 8 gives an overview of the interconnection scheme at the device level. In order to illuminate the blue pixel, a voltage is applied to the p-contact for the Red, Green and Blue sub-pixel. The n-contact for the blue sub-pixel is then grounded which will result in only the blue device illuminating.

Some descriptive elements of the chip follow:
1. The ILED array chips will be designed such that there are more than one emitting region per chip i.e. the chip is an array.
2. There will be one or more n contacts per chip.
3. A high resolution pixel of the overall image generator comprises several emitters from a plurality of ILED chips, as shown in FIG. 2.
4. The design will allow for the ILED array chips comprising a plurality of emitter sub pixels on one chip to be placed in close proximity to an adjacent ILED array chip, such that emitter on adjacent chips may together form a single display pixel. The design will aim to enable constant pitch between chips, pixels and/or emitters across the display.
5. The ILED array chips may be fabricated in a number of shapes including, but not limited to, triangles, squares, pentagons or hexagons. In exemplary methods and apparatus, the ILED array chips are shapes that are capable of tessellation.
6. The emitters may be placed at or near to the corners of a ILED array chip having a particular shape. This may minimise the distance between emitters on adjacent chips (shown as $D_e$ in FIG. 4)
7. For colour displays a white pixel can be formed by the adjacent positioning of ILED array chips having different wavelength emissions.
8. The adjacent pixels that form a white pixel may be individually connected or connected together. This is related to point 2—each emitter may have its own n-contact (individually addressable) or the emitter may share the n-contact with another emitter on the same chip (i.e. matrix addressing).
9. Control of the overall light output may be via the current and/or voltage at ap-contact of each emitter, at an n-contact of each emitter or at a mixture of both.
10. The ratio of colours in a multi-wavelength display may be decided by the chip design and the placement of the chips. The chip design and placement will dictate the number of pixels in the white pixel.

By way of example, several display assembly processes are disclosed. These display assembly processes highlight how the method described in the current invention may be integrated with standard process flows currently used in the display industry. These display assembly processes can be summarised as follows.

The first display assembly process discloses a method which is compatible with mainstream TFT manufacturing processing for control circuitry. In this method, the carrier substrate on which the ILED array chips are mounted is a standard component of the manufacturing process (such as the coverglass) and the interconnection to the driver electronics (such as the backplane) occurs as part of a standard TFT assembly process. In this platform the carrier substrate remains part of the display after assembly, and the TFT and the carrier substrate together form the backbone of the display.

The second display assembly process involves mounting the ILED array chips onto a temporary substrate used as a carrier, which is then attached by a suitable bonding method to the driver electronics of the display. The temporary substrate may then be removed, leaving the ILED array chips mounted on the CMOS. In this platform, the driver electronics form the backbone of the display and is associated with micro-displays on CMOS.

In a third flow, the driver electronics are discrete electronic chips and are assembly on to the carrier substrate. They are subsequently interconnected with the ILED array chips. In such an approach the carrier substrate is permanent and forms the backbone of the display.

It is noted that the substrate may be permanent in exemplary methods and apparatus, in particular if the substrate is transparent (e.g. a glass substrate) to the wavelengths emitted by the ILED array chips. The substrate may then form an outer surface of the display.

It should be noted that for all the flows above the mounting of the ILED array chips onto a passive matrix array such that that active components are remote from the emitters is also possible and covered by the current invention.

A display assembly process disclosed combines high resolution ILED array chip array design assembled by micro-assembly methods making them compatible with TFT integration and manufacture. In exemplary methods, the process flows for the first and bullets above are largely the same as the method described above. The main differences are the components (TFT vs CMOS) and final form factor (carrier on or carrier off).

An example of such an assembly is disclosed herein. The resulting array chips, comprising a plurality of ILED array chips positioned such that pixels are formed from emitters of adjacent chips, are then assembled on a component of the final display. This is then interconnected with the TFT planar backplane containing TFT control circuitry. TFTs using amphorous Silicon (a-Si TFTs), Metal Oxide (MO-TFT's) or low temperature polysilicon (LTPS-TFT's) provide current to the ILEDs, thereby controlling their respective brightness.

The methods and apparatus disclosed comprise a display assembly process which deploys micro-assembly process which can fit into a cell production line of a LCD/TFT manufacturing line, i.e. replacing the polimide/gasket/liquid crystal injection/glass sandwich/polarizer with corresponding micro-assembly processing steps. Module production for IC placement, anisotropic conductive film (ACF) lamination and ribbon cables will be agnostic to OLED or ILED technology. The technology is considered not disruptive enough for a TFT line to manufacture. An advantage is that unlike LCD/TFT backplanes the micro ILED/TFT design does not suffer fill factor losses due to the need for backlighting. The final assembly metal bezel assembly and packaging removes the requirements for backlighting.

In exemplary methods and apparatus, the ILED array chips are designed specifically that multiple colour chips can be assembled in close proximity to essentially produce i high density white display pixels directly on the driver backplane. The image engine containing the ILED array chips in a display array and a TFT backplane can then be integrated with a controller IC and connected to a PCB motherboard by ACF/FPC cabling.

In the second display assembly process, the high resolution ILED array chips are mounted directly onto a suitable transparent substrate face up, i.e. with an emitting surface of the ILED array chips facing the transparent substrate. The transparent substrate can be temporary or permanently fixed to the ILED array chips. The ILED array chips are then connected to a driver backplane and IC controllers using a suitable wireless interconnect bonding method. Wireless direct bonding methods eliminate the need for wirebonds, solder bumping/flipchip techniques thus simplifying interconnections.

In exemplary methods and apparatus of forming the interconnections, covalent bonds room temperature bonds between silicon oxide or nitride surfaces of each chip are formed. The direct bond is characterized by a very high bond energy between the chip surfaces, which includes the metal patterns that form effective electrical connections between the chips. With this technique the low resistance of these electrical connections enables better power efficiency and reduces the overall power consumption of the module.

In general control electronics are not transparent. In the case of active backplanes used in backlit LCD displays, significant effort is made to minimize the size of the control circuits. This allows the maximum amount of light to travel through pixels without it being blocked by the circuits and wasted. In exemplary methods and apparatus, it is possible to use a passive matrix drive scheme. In a passive matrix drive scheme the anode and cathode control lines are arranged perpendicular to each other. The emitter (in this case the ILED array chips) are mounted such that ILED array chips can be selectively illuminated through the appropriate selection on the anode and cathode lines. The driver circuitry is located away from the light emitting and transmitting region. A benefit of such an arrangement is a simplification of the driver circuitry and an increase in the transparency for the display. However, this approach is limited in the size of the array due to the current that must be driven across multiple pixels and the associated losses.

The use of small ILED array chips for the image engine greatly reduces the issues associated with the yield losses of large monolithic array chips. When an emitter fails, the monolithic ILED chip must be discarded. In a small ILED array chip, the discarding of the chip results in a small loss of material. For a large monolithic array, a failed emitter results in the discarding of a chip with a large amount of working material and hence results in significant yield losses. It also allows for binning of the ILED array chips based on light output performance and hence provides for more uniform and less complex controller circuitry. The integration of the light source directly onto a driver backplane and has a number of competitive advantages for higher density interconnect, minimal volume packaging with better performance and reliability The methods and apparatus disclosed may also incorporate a passive matrix. The benefits of this include the possibility of transparent display that would allow light to travel through it with minimal disruption. Such a concept could be applied to augmented reality systems or display contact lens.

The following definitions are used herein:
Carrier substrate: Encompasses a sheet of substrate that ILED chips are micro-assembled onto. The carrier substrate may be temporary, or a permanent transparent carrier substrate may be used.

Driver: The material on which the control electronics and/or the associated contacts are found. This may be a silicon wafer with driver electronics, a TFT backplane or other form of controller used in display technology.

Display pixel: Encompasses an RGB pixel that a user of a display sees.

Display sub-pixel: A small unit of the display pixel that is formed by a single colour and optionally by a single emitter.

Emitter: Encompasses the most fundamental building block of a display pixel and may be a micro ILED light source. An emitter may be on a micro ILED chip comprising a plurality of emitters. An emitter may comprise no smaller components capable of being individually addressed, although an emitter may comprise a single LED device or a cluster of LED devices.

Cluster: Encompasses a group of emitters which cannot be individually addressed. ILED chip: Encompasses a LED device (including an ILED chip) which has only one functional component (cluster or emitter). Note: this may be distinguished from an ILED array chip, in which LEDs may be addressed individually. An LED chip may contain PLED emitters, micro-HBD emitters or another type of small LED emitter.

ILED array chip: Encompasses a LED chip containing more than one individually addressable light emitting region.

Figure 3:
FIG. 3 shows a cross section AB through image engine.
Figure 9:
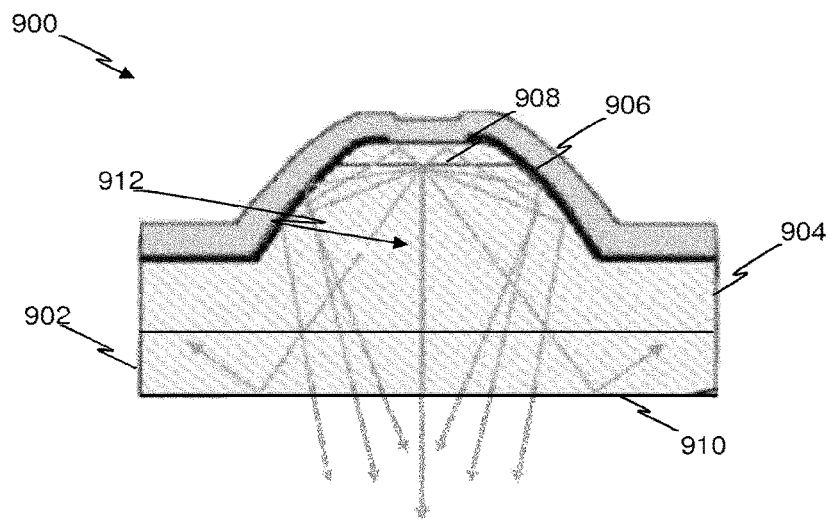
FIG. 9 shows a schematic representation of a micro ILED.

The ILED emitters may be micro ILED emitters as shown in FIG. 9, which shows a micro ILED structure 900 similar to that proposed in WO 2004/097947 (U.S. Pat. No. 7,518,149) with a high extraction efficiency and outputting quasi-collimated light because of its shape. Such a micro ILED 900 is shown in FIG. 3, wherein a substrate 902 has a semiconductor epitaxial layer 904 located on it. The epitaxial layer 904 is shaped into a mesa 906. An active (or light emitting) layer 908 is enclosed in the mesa structure 906. The mesa 906 has a truncated top, on a side opposed to a light transmitting or emitting face 910. The mesa 906 also has a near-parabolic shape to form a reflective enclosure for light generated or detected within the device. The arrows 912 show how light emitted from the active layer 908 is reflected off the walls of the mesa 906 toward the light exiting surface 910 at an angle sufficient for it to escape the LED device 900 (i.e. within the angle of total internal reflection).

Methods and apparatus disclosed herein may be defined by the following numbered clauses:

An addressable micro-image engine comprising:
    a. ILED array chips tiled to form the high resolution display pixels of micro display array using a micro-assembly technique
    b. Display pixel comprising one or more ILED emitters
    c. ILED array chips comprising one or more ILED light emitters
    d. A single ILED array chip may share emitters with more than one display pixels such that neighbouring display pixels may use different emitters from the same micro ILED array chip.
2. As 1, where the ILED array chips are of one or more wavelengths.
3. As 1, where the material is GaN, GaAs, GaP or any other light emitting semiconductor material.
4. As 1, where the individual ILED array chips are assembled using micro-assembly methods.
5. As 1, where the spacing between the ILED array chips are <100 μm.

6. As 1, where the light is generated by a laser diode, VCSEL, RCLED or any other form of light emitting semiconductor.

(The module)

7. An addressable array micro-display module comprising:
   a. ILED array chips tiled together to form a high resolution array of pixels
   b. Driver electronics which decide the emitters to be illuminated based on incoming information
   c. A method of interconnection between the driver and the ILED array chips. 8. A micro-assembly fabrication platform comprising:
      i. ILED array comprising of an array of High performance ILED array chips
      ii. A temporary or permanent carrier platform
      iii. A method for direct integrating the ILED array to the driver using micro-assembly methods or direct bonding to manufacture the ILED image generator.
      iv. A method of manufacturing ILED array chips and Backplane circuitry that is micro-assembly ready to assemble to the carrier platform.
9. As 7, where the driver is an active backplane consisting of low temperature polysilicon (LTPS)
10. As 7, where the driver is an amorphous silicon (a-Si) type.
11. As 7, where the driver is via contact lines and the controller chip is remotely located.
12. As 7, where the driver is a CMOS chip.
13. As 7, where the interconnection method is via solder balls.
14. As 7, where the interconnection occurs via a direct bonding interconnect type process.
15. As 7, where the interconnection occurs via a metal-to-metal type process.

(The ILED array chip)

16. An ILED array chip comprising:
    a. ILED array chips with more than one addressable emitting region;
    b. ILED array chips which have configurations which are triangular, square, hexagonal or other shape with ILED emitters place at the corners.
17. The number of emitters may be related to the number of corners in the design. For example, a square chip may have 4 emitters, a pentagon may have emitters, a hexagon may have 6 and so forth.
18. The shape of the ILED array chip is related to the display pixel design and is not arbitrarily chosen based on the specification of the LED manufacturing process.
19. The ILED array chip may contribute emitters to more than one display pixel.
20. The ILED array chip may have more than one pixel in each corner to allow for redundancy.
21. The emitting region may be due to a LED, Laser, VCSEL, RCLED or other light emitting semiconductor structure.
22. The emitters of the array as in the form of a p LED, a HBD or any other form of small emitter.
23. The ILED array chip may be driven using a matrix addressing scheme.
24. The ILED array chip may be driven using an individually addressing scheme.
25. The p-contacts for emitter on separate ILED chips may be connect together such that illumination is controlled by both the bias at the p-contact and that of the shared n-contact.

(The Assembly Process)

26. A method of fabrication of a high density display device comprising some or all of the following steps:
    Small ILED array chips are fabricated in a pre-selected shape. In general, the PLED emitter will be at the corner of the shape.
    The ILED array chips will consist of a number of emitter pixels with associated p-contacts and 1 or more n-contacts.
    Pixelated ILED array chips are mounted on a carrier substrate and held in place with glue or other bond material. A single colour/wafer type is placed at a time. Subsequent steps are taken until all colours/chips required are placed on the substrate.
    The electrical contacts for the chips will be facing away from the carrier substrate.
    The substrate may be transparent or non-transparent. The glue may be removable or non-removable. Removable glue must be used for non-transparent substrates.
    This arrangement above forms the image engine component of the device.
    The carrier substrate is then interconnected with driver electronics. This may occur via flip-chip mounting to a silicon wafer on which the driver chips have been fabricated using a Direct Bonding Interconnect (DBI) process, or other similar process.
    Both the ILED dies and the silicon wafer will be designed so that the pads are compatible and appropriate metal finishing will be applied to both sides as required by the DBI process
    At this point the carrier substrate can now be removed, if required. The transparent carrier wafer is now removed.
    Alternatively, the carrier substrate may be used to integrate any additional components for the performance of the devices. These may include, but are not limited to, optical devices or electrical components.
    The combined ILED/Silicon structure is now diced—resulting in a single chip colour micro-display
27. As 26, where the ILED chips are interconnected to the driver as part of the standard display manufacturing process
28. As 26, where the cover glass of the display acts as a carrier substrate.
29. As 26, where the driver is an active backplane type device.
30. As 26, where the active backplane is fabricated with amorphous silicon (a-Si) or low temperature poly silicon (LTPS) or Metal Oxide (MO-TFTs)

(the carrier substrate)

31. The carrier substrate may be glass, plastic or another transparent material.
32. The carrier substrate may be rigid or flexible.
33. The carrier substrate may be permanent or removable.
34. The carrier substrate may contain additional optical components to further manipulate the light.

(General Performance)

35. The light output from the display is greater than 50 cd/m2
36. The pitch between the pixels in the display is less than 100 μm.
37. The size of the display may range from, but is not limited to, 16×16 pixels to 2560×2480.
38. Each emitter in the display may consume between 1 nA and 1 A of current.

39. A microassembly fabrication platform comprising of
   i. ILED array comprising of an array of High performance ILED chips
   ii. A temporary or permanent carrier platform
   iii. A method for direct integrating the ILED array to the driver using microassembly methods or direct bonding to manufacture the ILED image engine.
   iv. A method of manufacturing ILED chips and Backplane circuitry that is microassembly ready to assemble to the carrier platform.
40. A micro-assembly fabrication platform consisting of
   a. ILED array chips tiled to form a larger array using a micro-assembly process
   b. Driver electronics which are used to control the emitters in the array.
   c. A method for interconnection of the ILED array and the driver.
41. A ILED array chip comprising
   a. ILED array chips with more than one addressable emitting region.
   b. ILED array chips which have configurations which are triangular, square, hexagon or other shape with ILED emitters place at the corners.
   c. The number of emitters may be related to the number of corners in the design. For example, a square chip may have 4 emitters, a pentagon may have 5 emitters, a hexagon may have 6 and so forth.
   d. The ILED array chips are a single wavelength or multiple wavelengths.
   e. Each ILED array chip may contribute emitters to more than 1 display pixel.
42. A Carrier Substrate may be used as part of one fabrication platform such that:
   a. The ILED array chips may be mounted on a temporary or permanent carrier substrate prior to interface with the driver.
   b. The carrier substrate may or may not be removed after interface with the controller electronics.
   c. The carrier substrate may contain micro-optics to enhance the performance of the ILED devices.
   d. Micro-optics may be mounted directly on the light exiting face of ILED array chips to enhance their performance.
   e. Micro-optics may be created on the light exiting face of ILED through stamping, lithography or other process.
   f. A light absorbing material may be placed between the chips to enhance the contrast of the pixels.
   g. A thermally conductive material may be placed between the chips for thermal management of the devices.
   h. A thermal conductive layer may be used on the N-side of the devices to enhance the thermal management.
   i. The ILED array chips may be driven using an active or a matrix addressing scheme.
   j. The interconnection layer may address emitters from more than 1 ILED array chip.
   k. The p contact for each LED is on the same side as the controller chip.
   l. The n contact for each may be on the same or a different side to the controller chip.
   m. The current through the emitter may be controlled via the p-contact, the n-contact or a mixture of both.
43. Controller/Assembly
   a. There are more than 1 ILED chips mounted on a single controller chip.
   b. The driver electronics may be in the form of an active backplane.
   c. The driver electronics may be in the form of a CMOS chip
   d. The driver electronics may be in the form of a control lines for a passive matrix drive scheme.
   e. The active backplane may be in the form of LTPS
   f. The active backplane may be in the form of a-Si.
44. In another embodiment of the assembly, the electrical contacts for the core device may be tracked to a point for connection. This tracking may be metallic or of other type such as conductive oxide. These may then terminate in mounting pads which will allow the connection of the control electronics.
45. The light output from the display is greater than 50 cd/m2
46. The pitch between the pixels in the display is less than 100 μm.
47. The size of the display may range from, but is not limited to, 16×16 pixels to 2560×2480.

The invention claimed is:

1. A display, comprising:
   inorganic light emitting diode (ILED) array chips configured to produce light having different wavelengths, each ILED array chip including ILED emitters configured to produce light having the same wavelength; and
   one or more control chips having discrete control electronics, the one or more control chips being interconnected to the ILED array chips, wherein a pixel of the display is formed with a plurality of ILED emitters of different wavelengths from adjacent ILED array chips.

2. The display of claim 1, wherein the ILED array chips include a first ILED array chip including first ILED emitters configured to produce a red light, a second array ILED array chip including second ILED emitters configured to produce a green light, and a third ILED array chip including third ILED emitters configured to produce a blue light.

3. The display of claim 1, wherein the ILED emitters of each ILED array chip are individually addressable.

4. The display of claim 1, wherein the discrete control electronics include complementary metal-oxide-semiconductor (CMOS) circuitry or thin-film transistor (TFT) circuitry.

5. The display of claim 1, wherein the discrete control electronics include an active backplane.

6. The display of claim 1, wherein at least one ILED emitter of an ILED array chip includes semiconductor material including one of:
   gallium nitride (GaN);
   gallium phosphide (GaP); or
   gallium arsenide (GaAs).

7. The display of claim 1, wherein the ILED array chips are bonded to the one or more control chips such that electrical contacts of the ILED array chips are in electrical communication with the control electronics for driving the ILED array chips.

8. The display of claim 1, wherein the ILED emitters of each ILED array chip include micro ILED emitters.

9. The display of claim 1, wherein each ILED emitter of each ILED array chip includes a reflective mesa structure for reflecting generated light at an angle such that the generated light escapes the ILED emitter.

10. The display of claim 1, further comprising a carrier substrate facing light emitting surfaces of the ILED array chips.

11. The display of claim 10, wherein the carrier substrate comprises one or more optical components configured to manipulate light emitted from the ILED array chips.

12. The display of claim 1, wherein the chips each include a rectangular, triangular, or hexagonal shape.

13. The display of claim 1, wherein each ILED emitter of each ILED array chip includes semiconductor epitaxial layer shaped into a mesa structure and an active light emitting layer in the mesa structure.

14. The display of claim 13, wherein the mesa structure includes a truncated top at a side opposite to a light emitting surface of the ILED emitter.

15. The display of claim 1, wherein two adjacent pixels of the display each includes an ILED emitter from an ILED array chip.

16. The display of claim 1, wherein ILED emitters of an ILED array chip are located at corners of the ILED array chip.

17. The display of claim 1, wherein the pixel is formed with at least two ILED emitters from each of the adjacent ILED array chips.

18. The display of claim 1, wherein p-contacts of the plurality of ILED emitters from the adjacent ILED array chips that form the pixel are connected to each other.

19. The display of claim 18, wherein the n-contacts of the ILED emitters of each ILED array chip are connected to each other.

20. The display of claim 18, wherein the n-contacts of the ILED emitters of each ILED array chip are individually addressable.

* * * * *